US005723171A

United States Patent [19]
Cuchiaro et al.

[11] Patent Number: 5,723,171
[45] Date of Patent: Mar. 3, 1998

[54] INTEGRATED CIRCUIT ELECTRODE STRUCTURE AND PROCESS FOR FABRICATING SAME

[75] Inventors: Joseph D. Cuchiaro; Larry D. McMillan; Carlos A. Paz de Araujo, all of Colorado Springs, Colo.

[73] Assignee: Symetrix Corporation, Colorado Springs, Colo.

[21] Appl. No.: 772,606

[22] Filed: Dec. 23, 1996

Related U.S. Application Data

[63] Continuation-in-part of Ser. No. 477,111, Jun. 7, 1995, which is a continuation-in-part of Ser. No. 154,927, Nov. 18, 1993, Pat. No. 5,519,234, which is a division of Ser. No. 965,190, Oct. 23, 1992, abandoned, said Ser. No. 477,111, is a continuation-in-part of Ser. No. 993,380, Dec. 18, 1992, Pat. No. 5,456,945.

[51] Int. Cl.$^6$ ....................................................... B05D 5/06
[52] U.S. Cl. .................. 427/96; 427/123; 427/125; 427/383.1; 427/399; 427/404
[58] Field of Search ........................ 427/383.1, 404, 427/125, 123, 96, 399

[56] References Cited

U.S. PATENT DOCUMENTS

| | | | |
|---|---|---|---|
| 4,423,087 | 12/1983 | Howard et al. | 427/125 |
| 4,584,084 | 4/1986 | Asano et al. | 427/125 |
| 4,801,469 | 1/1989 | Norwood | 427/125 |
| 5,179,071 | 1/1993 | Ekin et al. | 427/125 |
| 5,190,601 | 3/1993 | Yamakawa et al. | 427/125 |
| 5,445,922 | 8/1995 | Maple . | |

*Primary Examiner*—Janyce Bell
*Attorney, Agent, or Firm*—Duft, Graziano & Forest, P.C.

[57] ABSTRACT

An electrode for a ferroelectric electronic device is formed on an $SiO_2$ isolation layer by depositing an adhesion layer, such as titanium, between about 25 Å and 500 Å thick, then a layer of a nobel metal, such as platinum, that is at least 10 times thicker than the adhesion layer. The electrode is then annealed at a temperature higher than the minimum oxide eutectic temperature of the adhesion layer. The electrode is moved into the annealing furnace at a ramp rate such that it reaches its anneal temperature in five minutes or less. The relative thinness of the adhesion layer and the quick ramp up of the anneal causes all the titanium to be tied up in the oxide before it can diffuse through the platinum, and prevents the formation of rutile phases of the titanium and defects such as voids and hillocks in the platinum, which can destabilize the electrode.

18 Claims, 2 Drawing Sheets

INTEGRATED CIRCUIT ELECTRODE STRUCTURE AND PROCESS FOR FABRICATING SAME

This application is a continuation-in-part of U.S. patent application Ser. No. 08/477,111 filed Jun. 7, 1995 which is a continuation-in-part of U.S. patent application Ser. No. 08/154,927 filed Nov. 18, 1993 which issued as U.S. Pat. No. 5,519,234 on May 21, 1996, which is a divisional application of U.S. patent application Ser. No. 07/965,190 filed Oct. 23, 1992, now abandoned; U.S. patent application Ser. No. 08/477,111 is also a continuation-in-part of U.S. patent application Ser. No. 07/993,380 filed Dec. 18, 1992, which issued as U.S. Pat. No. 5,456,945 on Oct. 10, 1995.

BACKGROUND OF THE INVENTION

1. Field of the Invention

The invention relates to electrode structures for integrated circuit capacitors and other thin-film electronic elements, and more particularly to such electrodes utilizing a noble metal in combination with a refractory metal adhesion layer.

2. Statement of the Problem

Electrodes formed of a noble metal are widely used in integrated circuits and other thin film electronic devices. Noble metal electrodes are particularly favored for the electrodes of ferroelectric devices, such as ferroelectric capacitors used in memory applications, because the most effective ferroelectrics are metal oxides that require annealing temperatures from about 600° C. to 850° C. in an oxygen atmosphere. Such anneals generally oxidize or melt other metals conventionally used for electrodes, and the resulting metal oxides can contaminate CMOS structures and are generally less conductive than desirable. The ability of the noble metals, such as platinum, to resist oxidation and retain excellent conductivity when exposed to oxygen at elevated temperatures makes them ideal for electrodes. For example, the electrical conductivity of platinum in thin films of 1000 Å to 5000 Å in thickness is about 0.5 to 0.8 ohms per square.

However, most state-of-the-art integrated circuit and thin film applications require that the ferroelectric capacitors be fabricated over an isolation layer, such as silicon dioxide ($SiO_2$). Platinum and other nobel metals do not generally bond well to such isolation layers. For example, the solid solubility of platinum in silicon dioxide is zero. Thus, the noble metal lies on the surface of the isolation layer, and will be prone to mechanical failure, such as peeling, as stresses are induced by the subsequent processing steps of the integrated circuit or other thin film electronic device. For this reason, an adhesion layer, such as titanium, is generally deposited between the isolation layer and the nobel metal electrode due to the ability of the adhesion layer to diffuse in platinum and react with silicon dioxide. See for example, U.S. Pat. No. 5,005,102 issued to William L. Larson on Apr. 2, 1991. The adhesion layer diffuses into the nobel metal and reacts with the isolation layer by forming an oxide which bonds well with the isolation layer. However, the adhesion material leads to further stability problems and reduced conductivity. See, for example, K. Sreenivas et al., *Investigation of Pt/Ti bilayer metallization on silicon for ferroelectric thin film integration*, J. of Applied Physics, Vol. 75 (1), 1 Jan. 1994, which is not prior art to the present invention. It has been found that all the combination adhesion layer/nobel metal electrodes in the prior art result in significant numbers of hillocks, voids and other defects which raise the resistivity and reduce the reliability of the electrodes. Further, titanium diffuses very rapidly in platinum, and in many cases during the subsequent anneal processes will pass completely through the platinum and form an insulating layer on the surface of the platinum. See, K. Sreenivas et al., Supra, p. 235. Thus, a structure and process that results in good conductivity and stability of electrodes for ferroelectrics and other materials requiring oxygen anneals at elevated temperatures is needed.

SUMMARY OF THE INVENTION

The invention solves the above problem and provides excellent nobel metal electrodes by minimizing the amount of the adhesion material in the adhesion layer. The invention also minimizes the rutile oxides in the adhesion material.

According to the invention, the layer of adhesion material should be 500 angstroms (Å) or less thick. Preferably, the thickness of the adhesion layer is between 25 Å and 500 Å. The ratio of the thickness of the adhesion layer to the thickness of the nobel metal layer is 1:10 or less. Preferably, the electrode is annealed in oxygen with a high ramp rate, i.e. a ramp rate such that it reaches its anneal temperature in less than ten minutes, and most preferably in five minutes or less.

The optimum electrode, for a silicon dioxide isolation layer, comprises a layer of titanium of about 200 Å thick formed on the silicon dioxide isolation layer, followed by a layer of platinum of about 2000 Å, with the electrode annealed at about 650° C. in oxygen with a ramp rate such that it reaches its anneal temperature in about 5 minutes or less.

The invention provides a method of fabricating a thin film electrode having a total thickness of less than 1 micron, said method comprising the steps of: providing a substrate; forming on said substrate an adhesion layer, said adhesion layer comprising a conductive material; forming on said adhesion layer a layer of a nobel metal different from said adhesion layer material, said layer of nobel metal being at least eight times thicker than the thickness of said adhesion layer; and annealing said electrode on said substrate at a temperature equal or greater than the minimum oxide eutectic temperature of said adhesion layer material. Preferably, step of forming an adhesion layer comprises forming a layer between 25 Å and 500 Å in thickness. Preferably, said nobel metal layer is at least 10 times thicker than said adhesion layer. Preferably, said step of annealing comprises moving said electrode on said substrate into an annealing furnace at a ramp rate such that it reaches said temperature within ten minutes. Preferably, said ramp rate is such that it reaches said temperature in five minutes or less. Preferably, said adhesion layer comprises titanium and said nobel metal comprises platinum. Preferably, the thickness of said titanium layer is 200 Å or less and the thickness of said platinum layer is at least 2000 Å. Preferably, said annealing temperature is between 622° C. and 850° C. and said anneal is performed for between five minutes and forty-five minutes. Most preferably, said annealing temperature is 650° C. and said anneal is performed for 30 minutes.

In another aspect, the invention provides a method of fabricating a thin film electrode, said method comprising the steps of: providing a substrate; forming on said substrate an adhesion layer of between 25 Å and 500 Å in thickness, said adhesion layer comprising a conductive material; forming on said adhesion layer a layer of a nobel metal different from said adhesion layer material; and annealing said electrode on said substrate at a temperature equal to or greater than the minimum oxide eutectic temperature of said adhesion layer material. Preferably, said adhesion layer comprises titanium and is 200 Å or less in thickness. Preferably, said step of annealing comprises moving said electrode on said substrate into an annealing furnace at a ramp rate such that it reaches said temperature within ten minutes. Preferably, said ramp rate is such that it reaches said temperature in five minutes or less.

In a further aspect the invention provides a method of fabricating a thin film electrode having a total thickness of less than 1 micron, said method comprising the steps of: providing a substrate; forming on said substrate an adhesion layer, said adhesion layer comprising a conductive material; forming on said adhesion layer a layer of a nobel metal different from said adhesion layer material; and annealing said electrode on said substrate at a temperature equal to or greater than the minimum oxide eutectic temperature of said adhesion layer material, said step of annealing comprising moving said electrode on said substrate into an annealing furnace at a ramp rate such that it reaches said temperature within ten minutes.

Preferably, said ramp rate is such that it reaches said temperature in five minutes or less. Preferably, said adhesion layer material is titanium and said nobel metal is platinum. Preferably, said annealing temperature is between 622° C. and 850° C. Preferably, said anneal is performed for between five minutes and forty-five minutes. Preferably, said annealing temperature is 650° C. and said anneal is performed for 30 minutes.

The invention also provides an integrated circuit ferroelectric capacitor comprising: a first electrode, a second electrode, and a ferroelectric material between said first and second electrode, said first electrode comprising: an adhesion layer comprising a layer of material up to 500 Å thick; and a nobel metal layer formed on said adhesion layer, said nobel metal layer comprising a material different than said adhesion layer material and being at least 8 times thicker than said adhesion layer. Preferably, said nobel metal layer is at least 10 times thicker than said adhesion layer. Preferably, said adhesion layer comprises titanium dioxide and said nobel metal comprises platinum. Preferably, said titanium oxide layer is up to 200 Å thick and said platinum layer is at least 2000 Å thick.

In yet another aspect the invention provides an integrated circuit ferroelectric capacitor comprising: a first electrode, a second electrode, and a ferroelectric material between said first and second electrode, said first electrode comprising: an adhesion layer formed of a first material; a nobel metal layer between said ferroelectric material and said adhesion layer, said nobel metal layer comprising a second material different than said first material, said nobel metal layer having a thickness T; and a diffusion region formed at the interface of said adhesion layer and said noble metal layer, said diffusion region comprising a region wherein said first material is diffused into said nobel metal layer, said diffusion region having a thickness L; and wherein L≦0.5 T. Preferably, L≦0.25 T. Preferably, said adhesion layer comprises titanium dioxide and said nobel metal comprises platinum.

In yet a further aspect the invention provides an electrode for use in combination with a ferroelectric material in an integrated circuit, said electrode comprising: an adhesion layer formed of a first material; a nobel metal layer between said ferroelectric material and said adhesion layer, said nobel metal layer comprising a second material different than said first material, said nobel metal layer having a thickness T; and a diffusion region formed at the interface of said adhesion layer and said noble metal layer, said diffusion region comprising a region wherein said first material is diffused into said nobel metal layer, said diffusion region having a thickness L; and wherein L≦0.5 T. Preferably, L≦0.25 T. Preferably, said adhesion layer comprises titanium dioxide and said nobel metal comprises platinum.

In still another aspect the invention provides an electrode for use in combination with a ferroelectric material in an integrated circuit, said electrode comprising: an adhesion layer comprising a layer of material less than 500 Å thick; and a nobel metal layer between said ferroelectric material and said adhesion layer, said nobel metal layer comprising a material different than said adhesion layer material. Preferably, said nobel metal layer is at least 8 times thicker than said adhesion layer. Preferably, said adhesion layer comprises titanium dioxide and said nobel metal comprises platinum.

In still a further aspect the invention provides an electrode for use in combination with a ferroelectric material in an integrated circuit, said electrode comprising: an adhesion layer; a nobel metal layer between said ferroelectric material and said adhesion layer, said nobel metal layer comprising a material different than said adhesion layer material and being at least 8 times thicker than said adhesion layer. Preferably, said adhesion layer comprises titanium dioxide and said nobel metal comprises platinum.

The invention further provides an electrode for use in combination with a ferroelectric material in an integrated circuit, said electrode comprising a layer comprising titanium, said layer being up to 400 Å thick. Preferably, said layer is up to 200 Å thick.

The above electrode has proven over several years to be stable and effective. A study of the electrode has shown that the quick ramping up to a temperature above the minimum oxide eutectic formation temperature of the titanium oxide, i.e. 622° C., limits the diffusion of the titanium to the portions of the platinum close to the titanium/platinum interface by tying up the titanium into titanium dioxide quickly. The small amount of titanium limits the amount of $TiO_2$ present and the rapid anneal prevents the formation of rutile phases of the titanium oxide, i.e. $Ti_2O_4$, $Ti_3O_6$, etc. $TiO_2$ has a volume expansion ratio as compared to titanium of 9:5, and the rutile phases have an even higher volume expansion coefficient. Thus, limiting the amount of titanium dioxide and particularly the rutile phases, results in less stress and greatly reduces the number of hillocks, voids, and other defects.

DETAILED DESCRIPTION OF THE PREFERRED EMBODIMENTS

Figure 2:
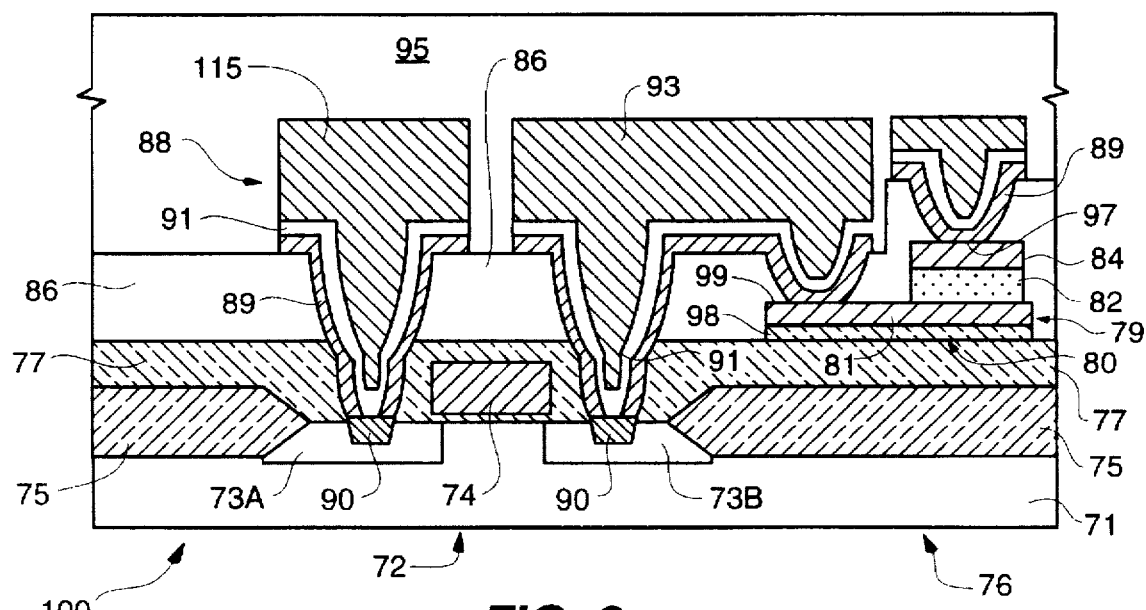
FIG. 2 is a cross-sectional view of the preferred embodiment of a DRAM integrated circuit memory cell made using the electrode structure and fabrication method of the invention.

In FIG. 2 there is shown a portion of typical integrated circuit 100 in which the electrode according to the invention is utilized. The portion shown comprises a 1T/1C DRAM/ FERAM memory cell 76 that includes a transistor 72 and a capacitor 80. The memory cell 76 is a DRAM memory cell when layer 82 is a dielectric and is an FERAM memory cell when layer 82 is a ferroelectric. Therefore we shall refer to it as a DRAM/FERAM cell 76 that includes a dielectric/ ferroelectric layer 82, or simply as a memory cell 76. Capacitor 80 is formed on a thick insulating layer 77 which separates the capacitor from the transistor 72. This embodiment is particularly preferred for ferroelectric or dielectric materials, such as ABO$_3$ type oxides and layered superlattice materials, when it is required or desired to isolate the capacitor ferroelectric/dielectric 82 from the transistor 72 to prevent migration of atoms in the ferroelectric/dielectric to the silicon of the transistor. Integrated circuit 100 includes an underlying substrate 71, preferably a single crystal silicon wafer, on which transistor 72 is formed. Transistor 72 comprises source/drain active areas 73A and 73B, formed by doping areas of underlying substrate 71, and gate 74. Integrated circuit 100 further includes field oxide areas 75, and first insulating layer 77 on which capacitor 80 is formed. First insulating layer 77 includes a gate oxide and a thermal oxide which, as is well-known, are formed in different steps but essentially merge because they are made of the same material. First insulating layer 77 further also may include other layers as described in U.S. Pat. No. 5,468,684 issued Nov. 21, 1995. Capacitor 80 includes first electrode 79, ferroelectric/dielectric layer 82, and second electrode 84. First electrode 79 includes an adhesion layer 98 and a nobel metal 81. Second insulating layer 86 overlies the capacitor 80, and wiring layer 88, often referred to as a metallization layer, connects the active area 73B with first electrode 81 of capacitor 80, and active area 73A and second electrode 84 with other portions of the circuit. Wiring layer 88 is preferably a multilayered structure including a layer 89, which layer is preferably made of platinum but preferably in the anneal process forms platinum silicide in the area 90 where it contacts the active areas 73A and 73B, a second layer 91, preferably made of titanium, and a third layer 93, preferably made of platinum, which contacts the surfaces 99 and 97 of capacitor electrodes 81 and 84 respectively. A capping layer 95, preferably a hermetic material such as silicon nitride or silicon oxynitride, or alternating layers of undoped silicon dioxide and phosphorous-doped SOG, completes the layered structure of the integrated circuit. Again, the invention particularly relates to a method of fabricating an electrode 79, therefor the structure and method of fabrication of such an electrode will be discussed in more detail below. The other portions may be fabricated as disclosed in U.S. Pat. No. 5,468,684 issued Nov. 21, 1995 or any other conventional manner. As is well-known, integrated circuits such as 100 are generally made on a wafer which is subsequently sawed into hundreds of individual integrated circuit chips, each chip containing thousands or millions of cells 76. Each chip is then packaged to produce the finished integrated circuit.

In the discussions below, we shall discuss the method of the invention in terms of the DRAM/FERAM embodiment of FIG. 2, since this is the preferred embodiment of an electronic device 100 utilizing the structure and process of the invention. However, it should be understood that the method can also be used in combination with other DRAM/FERAM embodiments and many other electronic devices utilizing thin film electrodes. Further, it should be understood that the capacitor of FIG. 2 is a generalization useful to show the general relationship of the capacitor and its parts to the other parts of the integrated circuit, and that actual capacitors formed by the process of and utilizing the structure of the invention may have somewhat different form.

It should be understood that the term "substrate" is often used ambiguously in the art of integrated circuits. Often it is used to refer to the silicon, gallium arsenide or other wafer, such as 71 in FIG. 2, on which the integrated circuit is fabricated. We have referred to these as the "underlying substrates" above. At other times the term is used to refer to the incomplete portion of the integrated circuit on which a particular layer is formed. For example, in this sense, the "substrate" on which capacitor 80 in FIG. 2 is formed is in general terms the incomplete integrated circuit through layer 77. At still other times the word "substrate" is used to mean the immediate layer on which a material is formed. In this sense the layer 77 is the immediate substrate on which capacitor 80 is formed. In this specification, the term "substrate" is used broadly to mean any layer on another layer is formed. In particular, when a capacitor, such as 80 in FIG. 2, is being discussed, the "substrate" most immediately is the layer 77 and more generally layer 77 and the layers below it. When an active layer, such as the ferroelectric/ dielectric layer 82 in FIG. 2, is being discussed, then the "substrate" most immediately is the nobel metal layer 81 and more generally bottom electrode 79 and all the layers of the incomplete integrated circuit below it.

It should also be understood that the term "thin film" in the present disclosure means films that are thin from an integrated circuit standpoint. That is, the term "thin film" is sometimes used in the macroscopic device art as meaning films of less than about 100 microns thickness. Generally these so-called "thin films" are more than a micron thick at their thinnest. Such films are not thin by integrated circuit standards and are always made by processes that are incompatible with integrated circuits. In this disclosure "thin film" means a film that is less than 1 micron thick, and preferably less than 0.5 microns thick.

Figure 1:
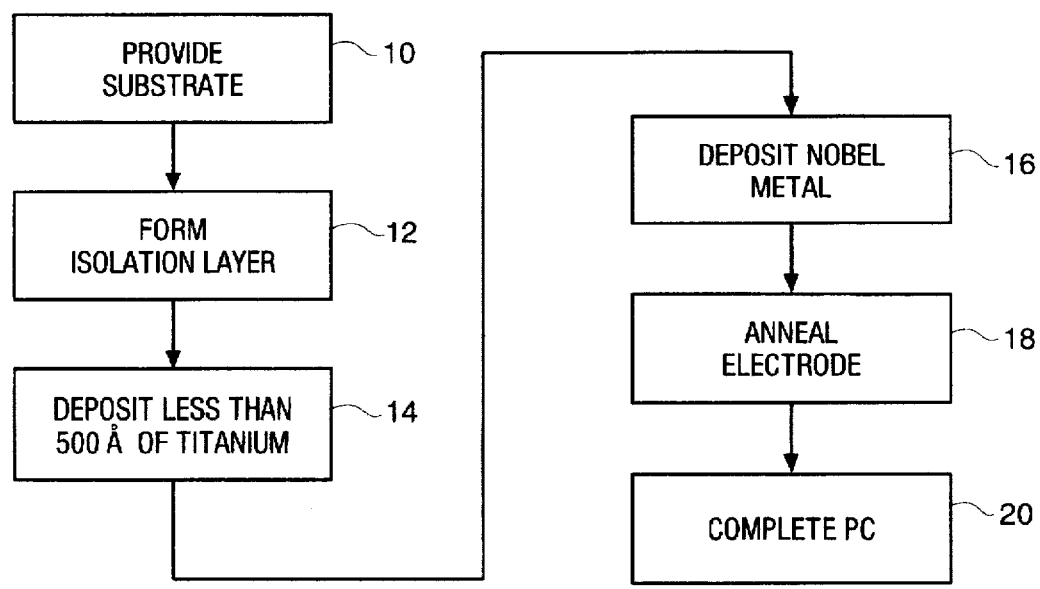
FIG. 1 is a flow chart illustrating the principal steps of the process of forming an electrode according to the invention.
Figure 3:
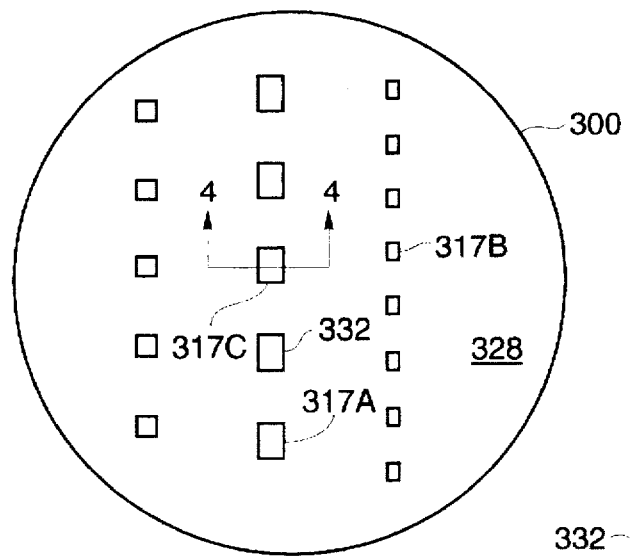
FIG. 3 is a top view of a silicon wafer on which thin film capacitors according to the invention are shown greatly enlarged.
Figure 4:
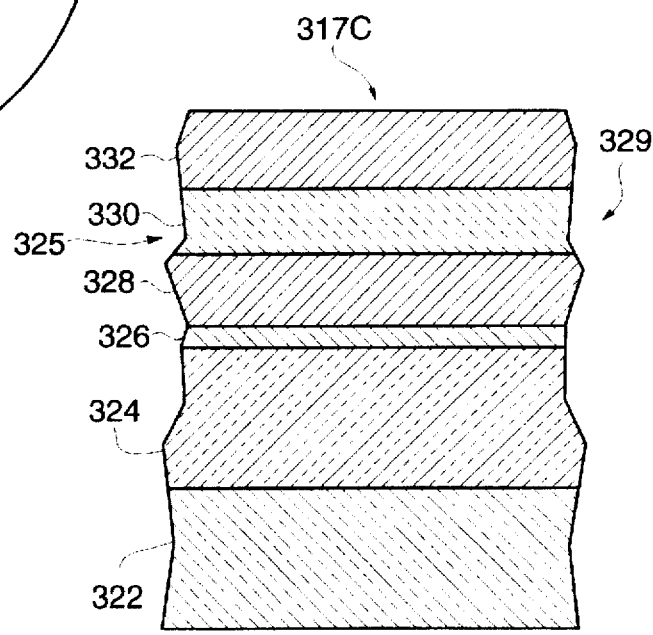
FIG. 4 is a portion of the cross-section of FIG. 3 taken through the lines 4—4, illustrating a thin film capacitor device according to the invention.

Turning to FIG. 1, a flow chart showing the steps of the preferred process according to the invention is shown. This process will be discussed in terms of an exemplary wafer 300 (FIGS. 3–5) on which test samples of thin-film capacitor devices of integrated circuit quality according to the invention have been fabricated. It should be understood that these figures are not meant to be actual plan or cross-sectional views of any particular portion of an actual capacitor, but are idealized representations which are employed to more clearly and fully depict the structure and process of the invention than would otherwise be possible. FIG. 4 shows a cross-section of the wafer 300 of FIG. 3 taken through the line 4—4. Referring to FIGS. 1, 3, 4, and 5, the wafer 300 preferably comprises a P-type silicon substrate 322 which was provided in step 10 (FIG. 1). In step 12 an approximately 5000 Å silicon dioxide insulating layer 324 was water vapor grown. Then, in step 14 a thin, adhesion layer 326 was deposited on the silicon dioxide 324, preferably by sputtering in situ. Preferably, the layer 326 is titanium 500 Å or less thick, and most preferably it is a 200 Å thick layer of titanium. Then, in step 16, a nobel metal layer 328 of thickness T (FIG. 5) is deposited. Preferably, the nobel metal is platinum, but also may be palladium or any other nobel metal. Preferably the layer 328 is at least 10 times thicker than the adhesion layer 326. Most preferably, it is 2000 Å of platinum 328 and is deposited by sputtering in situ. By "in situ" is meant that both the titanium and the platinum are sputtered without breaking vacuum. As will be discussed in detail below, the titanium reacts with the silicon dioxide and diffuses into the platinum where it is oxidized, and because a minimum amount of titanium is used, there is essentially a continuity of titanium dioxide from interior of the silicon into the platinum, which assists the platinum 328 in adhering to the silicon dioxide 324. In step 18 the electrode 329 is annealed. Preferably, the anneal is in an oxygen furnace at between 450° C. and 850° C. for from 5 minutes to 45 minutes, plus push and pull time. Preferably the wafer is introduced into the furnace at a ramp rate of 5 inches per minute or more, which in terms of temperature, results in a temperature ramp rate from the initial temperature of about 100° C. to 150° C. up the full anneal temperature in under ten minutes. Most preferably, the oxygen is 100% with a flow of 5 liters per minute, the ramp rate is 9.0 inches per minute, which results in a temperature ramp rate of five minutes or less from the starting temperature (100° C. to 150° C.) up to a furnace temperature of 650° C., and the total anneal time is 30 minutes plus the time to push the elephant into the furnace and pull it out. Alternatively, a reduced pressure of oxygen or less than 1 atmosphere may be used. In the anneal process, the titanium diffuses into the platinum a distance L. The titanium also diffuses into and reacts with the silicon dioxide to form a thin layer 326' (FIG. 5) of mixed titanium dioxide and silicon dioxide. Near the interface with thick silicon dioxide layer 324 the layer 326' is primarily silicon dioxide with some silicon that was formed by reducing the silicon dioxide, and near the interface with the layer 327 is primarily titanium dioxide with some silicon that was formed by reducing silicon dioxide. Within the diffusion length L, the titanium forms titanium dioxide which lies along the grain boundaries of the platinum grains. The length L is equal to or less than ½ the thickness T of the platinum layer 328, and preferably between 0.1 and 0.25 times the platinum thickness. Then, in step 20, the integrated circuit is completed. This completion step includes forming a layer 330 of a ferroelectric or dielectric material via processes that will be described in detail below, and a second electrode 332. Second electrode 332 is preferably a 2000 Å layer of platinum 332, and is preferably formed by sputtering. However, it also may be a multilayered electrode, such as a layer of platinum, a layer of another metal, such as tungsten or nickel, and a layer of aluminum. Or it may be some other electrode structure. The material 330 is preferably a layered superlattice material, such as strontium bismuth tantalate, strontium bismuth tantalum niobate, and barium bismuth niobate. A complete description of a layered superlattice material is given in U.S. Pat. No. 5,519,234 issued to the present inventors on May 21, 1996. The material 330 may also be an $ABO_3$ type perovskite, such as BST and PZT, or other metal oxide material. After deposition of the material 330, the wafer 300 is annealed again, patterned with a photo-mask process, and etched down to the electrode layer 328 to produce rectangular capacitor devices 317A, 317B, 317C, etc. (FIG. 3) of various sizes separated by large areas of the electrode 328. The size of the devices 317A, 317B, 317C, etc. is greatly exaggerated in FIG. 3. Each device 317A, 317B, 317C, etc. may be tested by connecting one lead of the test device to the platinum electrode layer 328 and contacting the other electrode layer 332 of the particular device 317A, 317B, 317C etc. with a fine probe connected to the other lead of the test device.

Figure 5:
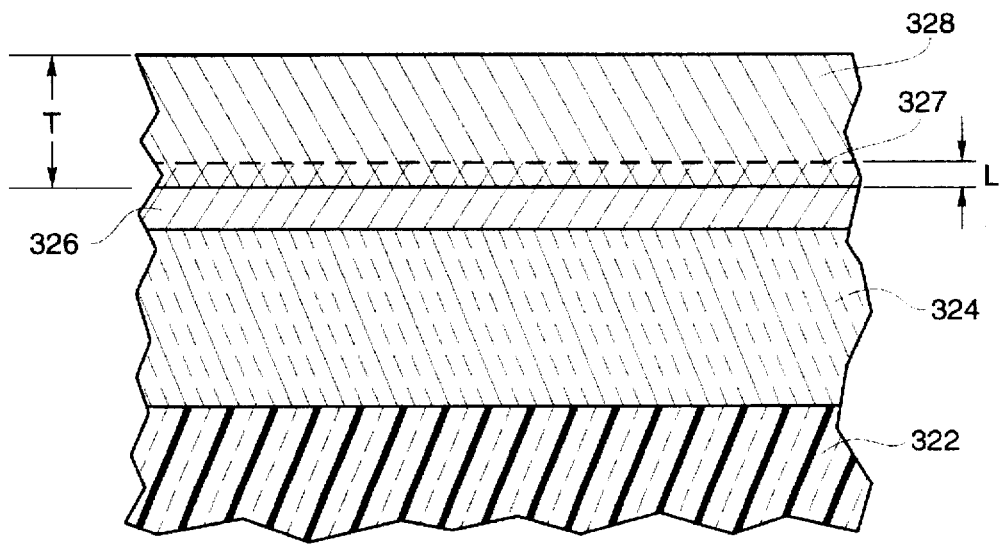
FIG. 5 shows in detail the bottom electrode structure of the capacitors of FIGS. 2, 3 and 4 illustrating the aspects of the electrode that are important to the invention.

The fabrication of exemplary devices of the types shown in FIGS. 3–5 will be described in detail in the examples below. Each description is preceded by a table listing the reactive components utilized in the fabrication process and each is followed by a description of the ferroelectric and/or dielectric properties as appropriate. The solvents used are described in a description of the process following each table. In the tables, "FW" indicates formula weight, "g" indicates grams, "mmoles" indicates millimoles, and "Equiv." indicates the equivalent number of moles in solution. "Xylenes" indicates a commercially available xylene solution which includes three different fractionations of xylene or, alternatively, simple para, meda, or ortho xylene. Bismuth 2-ethylhexanoate indicates a commercially available bismuth solution of bismuth 2-ethylhexanoate in 74% naphtha; the formula weight in this case is placed in parenthesis to indicate that it is an equivalent formula weight of bismuth in the solution as a whole, rather than the formula weight of just the bismuth 2-ethylhexanoate, to take into account the presence of the naphtha. All processes were performed at the atmospheric pressure in Colorado Springs, Colo., except where otherwise noted. In the first six examples below, all the initial wafer substrates on which the materials described were fabricated were layered substrates as illustrated by layers 322, 324, 326, and 328 in FIG. 4, which, after the electrode anneal step 18, becomes layers 322, 324, 326', 327 and 328 as shown in FIG. 5, with the silicon substrates 322 being made of P-type silicon of between 5 Ohms-cm and 25 Ohms-cm resistivity, having a field oxide layer 324 that was wet grown to about 5000 Å, a 200 Å thick layer 326 of sputtered titanium, and a 2000 Å layer 328 of sputtered platinum. After the layers 330 and 332 were deposited as described in the examples, the wafer 300 was patterned as illustrated in FIG. 3 using either a positive or negative photo resist in combination with a photo mask step. When a positive photo resist is indicated in an example, the resist is spun on at 5000 RPM, soft-baked on a hot plate at 95° C. for 2 minutes, followed by a standard photo mask process having a 7 second UV exposure, a 1 minute development and 1 minute water rinse, and a 5 minute hard bake at 140° C. When a negative photo resist is indicated in an example, the negative resist is spun on at 5000 RPM, soft-baked on a hot plate at 90° C. for 5 minutes, followed by a standard photo mask process utilizing a 4 second UV exposure, a 1 minute development and 1 minute water rinse, and a 5 minute hard bake at 140° C. When an IPC strip is indicated, this is an oxygen plasma strip using an Ion Plasma Corporation "barrel etcher" at 500 mTorr oxygen and 350 watts. When a rapid thermal process (RTP) is indicated, the process was done with an AG Associates model 410 Heat Pulser, the ramp rate given is for the period of increasing the temperature to the working temperature, and the time period given is the time for which the temperature was held at the working temperature. In all cases an oxygen flow of 3 liters/minute is used in the RTP anneals.

EXAMPLE 1

Strontium Bismuth Tantalate—$SrBi_2Ta_2O_9$

The compounds shown in Table I were measured.

TABLE I

| Compound | FW | g | mmole | Equiv. |
| --- | --- | --- | --- | --- |
| Tantalum ethoxide | 406.26 | 4.9553 | 12.197 | 2.0000 |
| 2-ethylhexanoic acid | 144.21 | 8.7995 | 61.019 | 10.006 |
| Strontium | 87.62 | 0.5330 | 6.0831 | 0.9975 |
| 2-ethylhexanoic acid | 144.21 | 1.7613 | 12.213 | 2.0026 |
| Bismuth 2-ethylhexanoate | (862.99) | 10.525 | 12.196 | 1.9998 |

The strontium was combined with the first measure of 2-ethylhexanoic acid and 80 ml 2-methoxyethanol. The mixture was stirred on low heat of between about 70° C. and 90° C. to hurry the reaction rate. When all the strontium was reacted and the solution had cooled to approximately room temperature, the tantalum ethoxide followed by the second measure of 2-ethylhexanoic acid were added. The mixture was stirred and heated to a maximum temperature of 115° C. to distill out ethanol and water. Then 75 ml xylenes followed by the bismuth 2-ethylhexanoate were added. The solution was stirred and heated with a maximum temperature of about 125° C. until only 60.0 ml of solution remained. The concentration was 0.102 moles of $SrBi_2Ta_2O_9$ per liter. The wafer was baked at 140° C. in air for 30 minutes to dehydrate it. An eyedropper was used to place 1 ml of the $SrBi_2Ta_2O_9$ solution on a wafer 300 as in FIG. 4 with the layers deposited up to and including the platinum bottom electrode 328. The wafer was spun at 15000 RPM for 20 seconds. The wafer was then placed on a hot plate and baked at about 250° C. in air for three minutes. The steps from using an eyedropper to deposit solution on the wafer through baking on the hot plate were repeated for another layer. The wafer was then transferred to a diffusion furnace and annealed at 750° C. in an oxygen flow of 5 l/m for 2 hours. The top layer 332 of 2000 Å platinum was sputtered, a resist was applied, followed by a standard photo mask process, an ion mill etch, an IPC strip and a final contact anneal at 750° C. in an oxygen flow of 5 l/m for 30 minutes. The resulting sample was tested and found to have a polarizability that had negligible fatigue over $10^{10}$ cycles. These results are phenomenal when compared to the prior art materials, and indicate that this capacitor would last indefinitely in a ferroelectric switching memory.

In more recent samples a precursor solution in xylenes as described above with a concentration of 0.2 moles $SrBi_2Ta_2O_9$ was diluted to 0.13 moles with n-butyl acetate and then spun onto the wafer and processed as described above. When tested, these samples not only showed negligible fatigue but the value of 2 Pr for two of the samples were 23.39 and 25.06 microcoulombs per $cm^2$ respectively, which is unusually high as compared to the prior art.

EXAMPLE 2

Strontium Bismuth Niobate—$SrBi_2Nb_2O_9$

The compounds shown in Table II were measured.

TABLE II

| Compound | FW | g | mmole | Equiv. |
| --- | --- | --- | --- | --- |
| strontium | 87.62 | 0.5625 | 6.4198 | 1.0000 |
| 2-ethylhexanoic acid/ | 144.21 | 2.0940 | 14.520 | 2.2618 |
| bismuth 2-ethylhexanoate | (862.99) | 11.079 | 12.838 | 1.9998 |
| niobium butoxide | 458.48 | 5.8862 | 12.839 | 1.9999 |
| 2-ethylhexanoic acid | 144.21 | 9.2911 | 64.428 | 10.036 |

The strontium was placed in 30 ml 2-methoxyethanol. The first measure of 2-ethylhexanoic acid was added and was allowed to react completely. The bismuth 2-ethylhexanoate was added, followed by 35 ml xylenes. The niobium butoxide and second measure of 2-ethylhexanoic acid was added, followed by 40 ml of xylenes. The mixture was heated and stirred, with a maximum temperature of 123° C., until all the butanol, water, and 2-methoxyethanol were removed. The final volume was 63 ml, and the final mass was 57.475 g. The concentration was 0.102 moles of $SrBi_2Nb_2O_9$ per liter, or 0.1117 mmoles of $SrBi_2Nb_2O_9$ per gram of solution. The wafer was baked at 140° C. in air for 30 minutes to dehydrate it. An eyedropper was used to place 1 ml of the $SrBi_2Nb_2O_9$ solution on a wafer as in FIG. 4 with the layers deposited up to and including the platinum bottom electrode 328. The wafer was spun at 1000 RPM for 20 seconds. The wafer was then placed on a hot plate and baked at 230° C. in air for two minutes and 30 seconds. The steps from using an eyedropper to deposit the $SrBi_2Nb_2O_9$ solution on the wafer through baking on the hot plate were repeated for another layer. The wafer was then transferred to a diffusion furnace and annealed at 750° C. in an oxygen flow of 5 l/m for 40 minutes. The top layer 332 of 2000 Å platinum was sputtered, a negative resist was applied followed by a standard photo mask process, an ion mill etch, an IPC strip and a final contact anneal at 750° C. in an oxygen flow of 5 l/m for 30 minutes. The resulting sample was tested. The sample was an excellent ferroelectric for a memory and was a relatively "fast" switching material.

EXAMPLE 3

Strontium Bismuth Tantalum Niobate—$SrBi_2TaNbO_9$

The compounds shown in Table III were measured.

TABLE III

| Compound | FW | g | mmole | Equiv. |
| --- | --- | --- | --- | --- |
| strontium | 87.62 | 0.5821 | 6.6435 | 1.0001 |
| 2-ethylhexanoic acid/ | 144.21 | 1.9770 | 13.709 | 2.0635 |
| bismuth 2-ethylhexanoate | (862.99) | 11.4687 | 13.289 | 2.0005 |
| tantalum butoxide | 546.522 | 3.6303 | 6.6426 | 1.0000 |
| niobium butoxide | 458.48 | 3.0456 | 6.6428 | 1.0000 |
| 2-ethylhexanoic acid | 144.21 | 9.6081 | 66.626 | 10.030 |

The strontium was placed in 30 ml of 2-methoxyethanol and the first measure of 2-ethylhexanoic acid was added and allowed to react completely. Then the bismuth 2-ethylhexanoate was added followed by 40 ml xylenes. The tantalum butoxide and the niobium butoxide were added, followed by the second portion of the 2-ethylhexanoic acid and 40 ml additional xylenes. The mixture was stirred and heated to a maximum temperature of 122° C. to distill out all water, butanol and 2-methoxyethanol until 65 ml of solution remained. The concentration was 0.102 moles of $SrBi_2TaNbO_9$ per liter. The wafer was baked at 140° C. in air for 30 minutes to dehydrate it. An eyedropper was used to place 1 ml of the $SrBi_2TaNbO_9$ solution on a wafer as in FIG. 4 with the layers deposited up to and including the platinum bottom electrode 328. The wafer was spun at 1000 RPM for 20 seconds. The wafer was then placed on a hot plate and baked at 250° C. in air for five minutes. The wafer was placed in a rapid thermal processor and annealed for 30 seconds in an oxygen flow of 3 l/m at a temperature of 700° C. with a 125°/sec ramp rate. The steps from using an eyedropper to place $SrBi_2TaNbO_9$ solution on the wafer through the RTP were repeated for another layer. The wafer was then transferred to a diffusion furnace and annealed at 750° C. in an oxygen flow of 5 l/m for 2 hours. A top layer 332 of 2000 Å platinum was sputtered, a positive resist was applied, followed by a standard photo mask process, an ion mill etch, an IPC strip and a final contact anneal at 750° C. in an oxygen flow of 5 l/m for 30 minutes. The resulting sample was tested and again showed little fatigue. More recent tests in strontium bismuth tantalate and strontium bismuth tantalum niobate samples made with 10% to 20% excess bismuth have shown essentially no fatigue out to $10^{12}$ cycles, which is nearly a million times better than the best prior art materials.

EXAMPLE 4

Barium Bismuth Tantalate—BaBi$_2$Ta$_2$O$_9$

The compounds shown in Table IV were measured.

TABLE IV

| Compound | FW | g | mmole | Equiv. |
| --- | --- | --- | --- | --- |
| barium | 137.327 | 0.9323 | 6.7889 | 1.0000 |
| 2-ethylhexanoic acid | 144.21 | 1.9733 | 13.684 | 2.0156 |
| bismuth 2-ethylhexanoate | (862.99) | 11.717 | 13.577 | 1.9999 |
| tantalum butoxide | 546.522 | 7.4211 | 13.579 | 2.0002 |
| 2-ethylhexanoic acid | 144.21 | 9.9216 | 68.800 | 10.134 |

The barium was placed in 40 ml of 2-methoxyethanol and 20 ml of toluene, to slow the reaction, and the first measure of 2-ethylhexanoic acid were added and allowed to react completely. Then the bismuth 2-ethylhexanoate was added followed by 40 ml xylenes. The solution was stirred and heated to a maximum temperature of about 123° C. to distill out water, the toluene and the 2-methoxyethanol. The solution was allowed to cool to room temperature, then the tantalum butoxide was added, followed by the second portion of the 2-ethylhexanoic acid and 40 ml additional xylenes. The mixture was heated to a temperature of about 123° C. while stirring to distill out the butanol until 66 ml of solution remained. The concentration was 0.103 moles of BaBi$_2$Ta$_2$O$_9$ per liter. The wafer was baked at 140° C. in air for 30 minutes to dehydrate it. An eyedropper was used to place 1 ml of the BaBi$_2$Ta$_2$O$_9$ solution on a wafer as in FIG. 4 with the layers deposited up to and including the platinum bottom electrode 328. The wafer was spun at 1000 RPM for 20 seconds. The wafer was then placed on a hot plate and baked at 250° C. in air for five minutes. The wafer was placed in a rapid thermal processor and annealed for 30 seconds in an oxygen flow of 3 l/m at a temperature of 700° C. with a 125°/sec ramp rate. The steps from using an eyedropper to place BaBi$_2$Ta$_2$O$_9$ solution on the spinner to the RTP were repeated for another layer. The wafer was then transferred to a diffusion furnace and annealed at 750° C. in an oxygen flow of 5 l/m for 2 hours. A top layer 332 of 2000 Å platinum was sputtered, a positive resist was applied, followed by a standard photo mask process, an ion mill etch, an IPC strip and a final contact anneal at 750° C. in an oxygen flow of 5 l/m for 30 minutes. The resulting sample was tested with the results shown in FIG. 8.

The BaBi$_2$Ta$_2$O$_9$ was not a switching ferroelectric, but was a paraelectric with a dielectric constant of 166 at 1 megahertz. This is a very high dielectric constant as compared to the dielectric constant of 3.9 for silicon dioxide, the most commonly used dielectric in integrated circuits. The leakage current curve for the BaBi$_2$Ta$_2$O$_9$ sample was also excellent, being negligible at low voltages, i.e. of the order of $10^{-10}$ amps/cm2. Over the range of voltages uses in conventional integrated circuits, i.e. 1–10 volts, the leakage current across the 2400 Å sample remained below about $10^{-8}$ amps/cm$^2$, which is still very small.

EXAMPLE 5

Lead Bismuth Tantalate—PbBi$_2$Ta$_2$O$_9$

The compounds shown in Table V were measured.

TABLE V

| Compound | FW | g | mmole | Equiv. |
| --- | --- | --- | --- | --- |
| Lead 2-ethylhexanoate in xylenes | (1263.6) | 16.691 | 13.209 | 1.1000 |
| bismuth 2-ethylhexanoate | (753.35) | 18.095 | 24.019 | 2.0002 |
| tantalum butoxide | 546.52 | 13.126 | 24.017 | 2.0001 |
| 2-ethylhexanoic acid | 144.21 | 17.967 | 124.59 | 10.375 |

The lead 2-ethylhexanoate in xylenes previously prepared stock solution and the bismuth 2-ethylhexanoate were combined, followed by 40 ml xylenes. Then the tantalum butoxide was added, followed by the 2-ethylhexanoic acid. The mixture was stirred on low heat of between about 70° C. and 90° C. for four hours, then raised to a maximum temperature of 114° C. to distill out the butanol until 66 ml of solution remained. The concentration was 0.172 moles of PbBi$_2$Ta$_2$O$_9$ per liter with 10% excess lead. The wafer was baked at 140° C. in air for 30 minutes to dehydrate it. An eyedropper was used to place 1 ml of the PbBi$_2$Ta$_2$O$_9$ solution on a wafer as in FIG. 4 with the layers deposited up to and including the platinum bottom electrode 328. The wafer was spun at 1000 RPM for 20 seconds. The wafer was then placed on a hot plate and baked at 375° C. in air for two and a half minutes. The steps from using an eyedropper to place the PbBi$_2$Ta$_2$O$_9$ solution on the wafer through baking were repeated for another layer. The wafer was then transferred to a diffusion furnace and annealed at 750° C. in an oxygen flow of 5 l/m for 90 minutes. A top layer 332 of 2000 Å platinum was sputtered, a negative resist was applied followed by a standard photo mask process, an ion mill etch, an IPC strip and a final contact anneal at 750° C. in an oxygen flow of 5 l/m for 30 minutes. The sample was tested and had a dielectric constant is 114 at 1 megahertz, which is smaller than that of BaBi$_2$Ta$_2$O$_9$, but still 30 to 40 times the dielectric constant of conventional semiconductor dielectrics. The leakage current was higher, but still below $10^{-7}$ amps/cm$^2$ for fields below about 500 kv/cm, which is excellent within the range of voltages common in integrated circuits. This material is of particular interest because the presence of lead makes it extremely resistant to radiation damage. The elements from which the material is compounded are also relatively compatible with conventional integrated circuit materials.

EXAMPLE 6

Barium Bismuth Niobate—BaBi$_2$Nb$_2$O$_9$

The compounds shown in Table VI were measured.

TABLE VI

| Compound | FW | g | mmole | Equiv. |
| --- | --- | --- | --- | --- |
| barium | 137.327 | 0.9419 | 6.8588 | 1.0000 |
| 2-ethylhexanoic acid | 144.21 | 2.0538 | | |
| bismuth 2-ethylhexanoate | (862.99) | 11.838 | 13.717 | 1.9999 |
| niobium butoxide | 458.48 | 6.2894 | 13.718 | 2.0001 |
| 2-ethylhexanoic acid | 144.21 | 10.051 | 69.697 | 10.162 |

The barium was placed in 30 ml of 2-methoxyethanol and 20 ml of toluene, to slow the reaction, and the first measure of 2-ethylhexanoic acid was added and allowed to react completely while stirring. Then the bismuth 2-ethylhexanoate was added followed by 50 ml xylenes. The mixture was stirred and heated with a maximum temperature of 118° C. to distill out all water, the toluene and the 2-methoxyethanol. The solution was allowed to cool to room temperature, then the niobium butoxide was added, followed by the second portion of the 2-ethylhexanoic acid and 30 ml additional xylenes. The mixture was heated to a temperature of 124° C. while stirring to distill out all butanol and water until 68 ml of solution remained. The concentration was 0.101 moles of $BaBi_2Nb_2O_9$ per liter. The wafer was baked at 140° C. in air for 30 minutes to dehydrate it. An eyedropper was used to place 1 ml of the $BaBi_2Nb_2O_9$ solution on a wafer as in FIG. 4 with the layers deposited up to and including the platinum bottom electrode 328. The wafer was spun at 1000 RPM for 20 seconds. The wafer was then placed on a hot plate and baked at 230° C. in air for two minutes. The wafer was placed in a rapid thermal processor and annealed for 30 seconds in an oxygen flow of 3 l/m at temperature of 700° C. with a 125°/sec ramp rate. The steps from using an eyedropper to place $BaBi_2Nb_2O_9$ solution on the wafer to the RTP were repeated for another layer. The wafer was then transferred to a diffusion furnace and annealed at 750° C. in an oxygen flow of 5 l/m for 1 hour. A top layer 332 of 2000 Å platinum was sputtered, a negative resist was applied, followed by a standard photo mask process, an ion mill etch, an IPC strip and a final contact anneal at 750° C. in an oxygen flow of 5 l/m for 30 minutes. The resulting sample was and had a dielectric constant was 103.46 at 1 megahertz. This is lower than the dielectric constants for $BaBi_2Ta_2O_9$ and $PbBi_2Ta_2O_9$, but still very high. The leakage current result again was not as excellent as for $BaBi_2Ta_2O_9$ and $PbBi_2Ta_2O_9$, but still below $10^{-6}$ amps per $cm^2$ for fields below about 300 kV/cm.

In the remaining examples, the layered superlattice material was deposited using a misted deposition process as described in U.S. Pat. No. 5,456,945 issued Oct. 10, 1995. In several of these examples, the titanium layer 326 (FIG. 4) was not used. The yield of acceptable capacitors was always much higher for the examples in which the titanium adhesion layer was used. As indicated above, in all examples in which the titanium was used, the titanium layer was approximately 200 Å thick and the platinum layer 328 was approximately 2000 Å thick.

EXAMPLE 7

The compounds shown in Table VII were measured.

TABLE VII

| Compound | FW | g | mmole | Equiv. |
| --- | --- | --- | --- | --- |
| Tantalum butoxide | 546.52 | 52.477 | 96.020 | 2.0000 |
| 2-ethylhexanoic acid | 144.21 | 87.226 | 604.85 | 12.598 |
| Strontium | 87.63 | 4.2108 | 48.052 | 1.0009 |
| Bismuth 2-ethylhexanoate | (790.10) | 82.702 | 104.67 | 2.1802 |

The tantalum butoxide and 2-ethylhexanoic acid were placed in a flask and about 50 milliliters (ml) of xylenes was added. The mixture was stirred on low heat of between about 70° C. and 90° C. for 48 hours. The strontium was added and the solution was again stirred on low heat until completely reacted. The temperature was then raised to a maximum of 120° C. while stirring to distill out the butanol, until there remained about 40 ml of distillate. Then the bismuth 2-ethylhexanoate was added and diluted to 240 ml with xylenes. The concentration was 0.200 moles of $SrBi_2Ta_2O_9$ per liter. This precursor was stored until ready for use.

Just prior to deposition, 4 ml of a strontium bismuth tantalate precursor as described above was placed in the mist generator along with 10 ml of methyl ethyl ketone (MEK) initiator. A substrate 325 comprising a silicon wafer 322 with layers of silicon dioxide 324 and platinum 328 deposited on it was placed in the deposition chamber on the substrate holder. In this case, there was no titanium layer 326. The $SrBi_2Ta_2O_9$ was deposited by the misted deposition process, then the wafer 300 was removed from the deposition chamber and placed on a hot plate where it was dried at a temperature of 150° C. for 2 minutes, then baked at a temperature of 400° C. for 5 minutes. The wafer 300 was then transferred to a rapid thermal processing oven where RTP was performed at 750° C. for 30 seconds. Then the wafer 300 was returned to the deposition chamber, the mist was formed again and the deposition steps were repeated with UV being applied to the mist and the wafer 300. The RTP process for the second layer was at 725° C. for 30 seconds in oxygen. The wafer 300 was then annealed in oxygen for one hour. The resulting film 330 was approximately 2100 Angstroms (Å) thick.

After the second anneal, the IC device 300 was completed, i.e. second platinum electrode 332 was sputtered on and the wafer was then etched using well-known photoresist techniques to produce a plurality of capacitors 317A, 317B, etc. electrically connected via bottom electrode 328.

Hysteresis measurements were made on the strontium bismuth tantalate capacitor fabricated by the above process using and uncompensated Sawyer-Tower circuit at 10,000 Hertz and at voltages of 1 volt, 1.5 volts, 2 volts, 2.5 volts, 3 volts, and 5 volts. The hysteresis curves were tall and boxy, indicating the capacitors would perform well in a memory. The polarizability, 2 Pr, was 20.9 microcoulombs/$cm^2$ for the 5 volt measurement. The coercive voltage, 2 Vc, was 1.66 volts. The measured leakage current for the same sample was about $7\times10^{-8}$ amps per square centimeter at 5 volts and significantly lower at lower voltages, which are again excellent results showing the material would perform excellently in a memory.

Another sample was prepared as in Example 7 above except that the substrate 325 included a 200 Å thick layer 326 of titanium. The polarizability for 5 volts was 12.9 microcoulombs/$cm^2$. The coercive voltage, 2 Vc, was measured as 2.16 volts. The measured leakage current at 5 volts was $5\times10^{-8}$.

The yield was found to be much better for the platinum/titanium electrodes. About half the devices shorted for the platinum only bottom electrodes, while none of the devices shorted for the platinum/titanium bottom electrodes.

Further examples of strontium bismuth tantalate capacitors were made as indicated in the misted deposition examples above, except that the substrates 325 were preannealed at 800° C. for 30 minutes in oxygen for the platinum bottom electrode samples and at 650° C. for 30 minutes in oxygen for the Ti/Pt samples. For the platinum-only bottom electrode samples, the yield dropped to only about 10% but the 2 Pr value rose to 21.6 microcoulombs/$cm^2$. For the Ti/Pt bottom electrodes, the yield stayed at 100%, but the polarizability dropped to 11.8 microcoulombs/$cm^2$.

EXAMPLE 8

Samples of strontium bismuth tantalum niobate capacitors were made as described in Example 7, with Ti/Pt bottom electrodes, except that a strontium bismuth niobate

15 precursor, made in the same way as the strontium bismuth tantalate precursor of Example 7 but with niobium isopropoxide replacing the tantalum butoxide, was added to the strontium bismuth titanate precursor. An amount of the strontium bismuth niobate precursor was added to yield an approximately 50/50 ratio of tantalum to niobium in the precursor. The thickness of the resulting ferroelectric layer 330 ranged from 1900 Å to 2300 Å, the polarizabilities ranged from 11.7 microcoulombs/$cm^2$ to 12.5 microcoulombs/$cm^2$ at 5 volts, the coercive fields, 2 Ec, from 124 volts/cm to 136 kilovolts/cm, and the leakage currents from $5 \times 10^{-6}$ amps/$cm^2$ to $1 \times 10^{-5}$ amps/$cm^2$ at 5 volts.

EXAMPLE 9

The compounds shown in Table VIII were measured.

TABLE VIII

| Compound | FW | g | mmole | Equiv. |
|---|---|---|---|---|
| Tantalum butoxide | 546.52 | 52.4650 | 96.020 | 2.0000 |
| 2-ethylhexanoic acid | 144.21 | 87.222 | 604.83 | 12.600 |
| Niobium isopropoxide | 388.35 | 11.184 | 28.799 | 0.6000 |
| Strontium | 87.63 | 5.0490 | 57.617 | 1.2003 |
| 2-ethylhexanoic acid | 144.21 | 24.710 | 171.35 | 3.5698 |
| Bismuth 2-ethylhexanoate | (753.08) | 105.44 | 140.01 | 2.7802 |

The tantalum butoxide, niobium isopropoxide, were placed in a flask with the first measure of 2-ethylhexanoic acid and about 50 milliliters (ml) of xylenes. The mixture was stirred on low heat of between about 70° C. and 90° C. for 48 hours. The second measure of 2-ethylhexanoic acid was added followed by the strontium. The solution was again stirred on low heat until completely reacted. The temperature was then raised to a maximum of 120° C. while stirring to distill out the butanol, until there remained about 40 ml of distillate. Then the bismuth 2-ethylhexanoate was added and diluted to 260 ml with xylenes. The concentration was 0.200 moles of $Sr_{1.2}Bi_{2.78}TaNb_{0.4}O_9$ per liter. This precursor was stored until ready for use.

Just prior to deposition 4 ml of a strontium bismuth tantalum niobate precursor as described above was placed in container 54 of mist generator 46 along with 10 ml of methyl ethyl ketone (MEK) initiator.

Using this precursor, samples of capacitors were made as described in Example 7, with titanium/platinum bottom electrodes. One sample had a film 330 thickness of 2150 Å, a polarizability, 2 Pr, of 12.7 microcoulombs/$cm^2$ at 5 volts, a coercive field, 2 Ec, of 166 kilovolts/cm, and a leakage current of $5 \times 10^{-5}$ amps/$cm^2$ at 5 volts. Another sample had a film 330 thickness of 2050 Å, a polarizability, 2 Pr, of 14.7 microcoulombs/$cm^2$ at 5 volts, a coercive field, 2 Ec, of 166 kilovolts/cm, and a leakage current of $4 \times 10^{-7}$ amps/$cm^2$ at 5 volts.

EXAMPLE 10

Several more samples were made as in Example 9, except that the final solvent added just prior to placing the precursor in the mist generator was n-butyl acetate instead of methyl ethyl ketone. In some instances the addition butyl acetate as a co-solvent with xylenes yields better quality devices, though the reasons are not yet fully understood. It is believed that n-butyl acetate generally wets the substrate better than xylenes and provides better step coverage. Both samples had film 330 thicknesses of 1850 Å, while one had a

16 polarizability, 2 Pr, of 14.1 microcoulombs/$cm^2$ at 5 volts, a coercive field, 2 Ec, of 182 kilovolts/cm, and a leakage current of $1 \times 10^{-7}$ amps/$cm^2$ at 5 volts, while the other had a polarizability, 2 Pr, of 12.9 microcoulombs/$cm^2$ at 5 volts, a coercive field, 2 Ec, of 199 kilovolts/cm, and a leakage current of $3 \times 10^{-7}$ amps/$cm^2$ at 5 volts.

Electrodes fabricated as described in the above examples have remained stable and highly conductive through as many as $10^{13}$ cycles of testing and over many years at room and at temperatures as elevated as 150° C. Subsequent analysis has shown that the layer 326' remaining after anneal contains virtually no unoxidized titanium. Thus, the titanium is all tied up in the oxide, and there is virtually no "free" titanium to migrate up through the platinum 328, which would alter the electronic properties of the capacitor, Further, it has been found that the vast majority of the titanium oxide is titanium dioxide. Thus, the large expansion coefficients of the rutile phase oxides are avoided.

As indicated in the examples above, the thickness of the nobel metal layer 328 should preferably be 10 times the thickness of the titanium layer 326. If the relative thicknesses are less than 10 to 1 (platinum to titanium) there is a good chance that some titanium may not be oxidized. This can severely degrade the yield and/or the electrical performance of the device. Further, if the length "L" in FIG. 5 is greater than 0.5 times the thickness T of the platinum layer 328, hillocks will form. Moreover, the resistivity of the electrode increases as the diffusion length, L, increases. Thus, it is very important that the thickness of titanium 326 be much less than the thickness of the platinum 328. Further, the minimum thickness of the platinum 328 must be greater than the diffusion length of the titanium and preferably two or more times the diffusion length.

It is also important that the adhesion layer 326 not only be thin in relation to the nobel metal layer 328, but also that the absolute thickness of the adhesion layer be small, i.e. between 25 Å and 500 Å. Otherwise the amount of titanium oxide in the region of the platinum grain boundaries will be so large that the differences in the expansion coefficients between the titanium oxide and the platinum 328 will create hillocks and other defects and will destabilize the electrode.

It is also important that the electrode anneal step 18 be ramped up to a temperature higher than the minimum oxide eutectic temperature of the adhesion material quickly, i.e. the device should be entered into the furnace at a ramp rate that reaches the full anneal temperature within ten minutes. Otherwise, even for thin layers of adhesion material 326, the material may diffuse entirely through the nobel metal 328 before it oxidizes and the oxidation may create the rutile phases of the oxide. Both results destabilize the electrode and degrade the electronic properties.

The electrodes according to the invention have been found to be very stable and to have a conductivity of from 0.7 ohms/square to 1.0 ohms/square, which compares favorably to the conductivity of a platinum only electrode.

Although there has been described what is at present considered to be the preferred embodiments of the present invention, it will be understood that the invention can be embodied in other specific forms without departing from the spirit or essential characteristics thereof. For example, other adhesion materials, such as ruthenium, may be used in place of titanium, and depending on the substrate, the adhesion material may form compounds other than oxides. The present embodiments are, therefore, to be considered in all aspects as illustrative and not restrictive. The scope of the invention is indicated by the appended claims rather than the foregoing description.

We claim:

1. A method of fabricating a thin film electrode having a total thickness of less than 1 micron, said method comprising the steps of:
   providing a substrate;
   forming on said substrate an adhesion layer, said adhesion layer comprising titanium;
   forming on said adhesion layer a layer of platinum, said layer of platinum being at least eight times thicker than the thickness of said adhesion layer; and annealing said electrode on said substrate at a temperature equal or greater than 622° C.

2. A method as in claim 1 wherein said step of forming an adhesion layer comprises forming a layer between 25 Å and 500 Å in thickness.

3. A method as in claim 1 wherein said platinum layer is at least 10 times thicker than said adhesion layer.

4. A method as in claim 1 wherein said step of annealing comprises moving said electrode on said substrate into an annealing furnace at a ramp rate such that it reaches said temperature within ten minutes.

5. A method as in claim 4 wherein said ramp rate is such that it reaches said temperature in five minutes or less.

6. A method as in claim 1 wherein the thickness of said titanium layer is 200 Å or less and the thickness of said platinum layer is at least 2000 Å.

7. A method as in claim 1 wherein said annealing temperature is between 622° C. and 850° C.

8. A method as in claim 7 wherein said anneal is performed for between five minutes and forty-five minutes.

9. A method as in claim 8 wherein said annealing temperature is 650° C. and said anneal is performed for 30 minutes.

10. A method of fabricating a thin film electrode, said method comprising the steps of:
    providing a substrate;
    forming on said substrate an adhesion layer of 200 Å or less in thickness, said adhesion layer comprising titanium;
    forming on said adhesion layer a layer of a nobel metal different from said adhesion layer material; and
    annealing said electrode on said substrate at a temperature equal to or greater than 622° C.

11. A method as in claim 10 wherein said step of annealing comprises moving said electrode on said substrate into an annealing furnace at a ramp rate such that it reaches said temperature within ten minutes.

12. A method as in claim 11 wherein said ramp rate is such that it reaches said temperature in five minutes or less.

13. A method of fabricating a thin film electrode having a total thickness of less than 1 micron, said method comprising the steps of:
    providing a substrate;
    forming on said substrate an adhesion layer, said adhesion layer comprising a conductive material having a minimum oxide eutectic temperature;
    forming on said adhesion layer a layer of a nobel metal different from said adhesion layer material; and
    annealing said electrode on said substrate at a temperature equal or greater than said minimum oxide eutectic temperature of said adhesion layer material, said step of annealing comprising moving said electrode on said substrate into an annealing furnace at a ramp rate such that it reaches said temperature within ten minutes.

14. A method as in claim 13 wherein said ramp rate is such that it reaches said temperature in five minutes or less.

15. A method as in claim 13 wherein said adhesion layer material is titanium and said nobel metal is platinum.

16. A method as in claim 13 wherein said annealing temperature is between 622° C. and 850° C.

17. A method as in claim 16 wherein said anneal is performed for between five minutes and forty-five minutes.

18. A method as in claim 17 wherein said annealing temperature is 650° C. and said anneal is performed for 30 minutes.

* * * * *